United States Patent
Vacherand et al.

(10) Patent No.: US 6,926,204 B2
(45) Date of Patent: Aug. 9, 2005

(54) SECURE ELECTRONIC DEVICE

(75) Inventors: François Vacherand, Le Pont de Claire (FR); Gilles Delapierre, Seyssing (FR); Didier Bloch, Bivers (FR)

(73) Assignee: Commissariat a l'Energie Atomique, Paris (FR)

( * ) Notice: Subject to any disclaimer, the term of this patent is extended or adjusted under 35 U.S.C. 154(b) by 82 days.

(21) Appl. No.: 10/477,640

(22) PCT Filed: Mar. 11, 2003

(86) PCT No.: PCT/FR03/00778
§ 371 (c)(1),
(2), (4) Date: Nov. 12, 2003

(87) PCT Pub. No.: WO03/077194
PCT Pub. Date: Sep. 18, 2003

(65) Prior Publication Data
US 2004/0134993 A1 Jul. 15, 2004

(30) Foreign Application Priority Data
Mar. 13, 2002 (FR) .......................... 02 03102

(51) Int. Cl.$^7$ .......................... G06K 19/06; G06K 5/00
(52) U.S. Cl. ...................... 235/492; 235/380
(58) Field of Search .............................. 235/492, 486, 235/487, 441, 380, 375, 493; 361/37, 49; 705/69, 44, 43

(56) References Cited

U.S. PATENT DOCUMENTS

| | | | | |
|---|---|---|---|---|
| 3,725,671 A | | 4/1973 | Keister et al. .............. 307/202 |
| 3,882,323 A | | 5/1975 | Smolker ...................... 307/202 |
| 4,926,480 A | * | 5/1990 | Chaum ........................ 705/69 |
| 5,060,261 A | | 10/1991 | Avenier et al. .............. 380/3 |
| 5,191,499 A | * | 3/1993 | Gaus et al. .................. 361/49 |
| 5,220,250 A | * | 6/1993 | Szuba .......................... 315/307 |
| 5,319,301 A | * | 6/1994 | Callahan et al. ............ 323/235 |
| 5,397,881 A | * | 3/1995 | Mannik ....................... 235/380 |
| 5,412,192 A | * | 5/1995 | Hoss ........................... 235/380 |
| 5,585,787 A | * | 12/1996 | Wallerstein ................. 340/5.42 |
| 5,821,703 A | * | 10/1998 | Callahan et al. ............ 315/317 |
| 5,883,429 A | | 3/1999 | Houdeau et al. ............ 257/704 |
| 5,898,556 A | * | 4/1999 | de Sedouy et al. .......... 361/37 |
| 5,998,858 A | | 12/1999 | Little et al. ................. 257/678 |
| 6,054,861 A | * | 4/2000 | Takahashi ................... 324/428 |

FOREIGN PATENT DOCUMENTS

| | | | | |
|---|---|---|---|---|
| DE | 39 20 957 A1 | 1/1991 | .......... H03K/17/96 |
| FR | 2 805 116 | 8/2001 | .......... H04M/11/04 |

* cited by examiner

Primary Examiner—Thien M. Le
(74) Attorney, Agent, or Firm—Thelen Reid & Priest LLP

(57) ABSTRACT

This invention relates to a secure electronic device comprising:
  at least an electronic circuit (10) containing information to be protected,
  an energy source (11);
  at least one sensor (12, 13, 14) capable of measuring a determined physical magnitude and outputting a value representative of this magnitude,
  means (15, 16, 17) of comparing each value with at least one predefined threshold (ref1, ref2, ref3) outputting result signals,
  a device (20) for protection of information comprising means for triggering destruction of at least part of the circuit using pyrotechnic means (27),
  a decision-making logical device (21) capable of activating the protection device after seeing the result signals,
  firing means (31) capable of priming a local or global pyrotechnic micro-charge (30) using electrical energy permanently stored in the energy source.

19 Claims, 4 Drawing Sheets

SECURE ELECTRONIC DEVICE

CROSS-REFERENCE TO RELATED APPLICATION

This application claims priority based on International Patent Application No. PCT/FR03/00778, entitled "Secured Electronic Device" by Francois Vacherand, Giles Delapierre, and Didier Bloch, which claims priority of French application no. 02 03102, filed on Mar. 13, 2002, and which was not published in English.

TECHNICAL DOMAIN

This invention relates to a secured electronic device, for example a circuit for a smart card.

STATE OF PRIOR ART

It is known that a power supply can be applied to smart cards according to prior art when they are inserted in a reader. It is only possible to provide active protection for the cards when they are in the reader. These cards have no means of detecting an invasive attack when they have no power supply. A dishonest person using a "reverse engineering" attack to retrieve confidential information, for example encryption keys and the personal identification number stored on this card has every chance of succeeding.

The expected arrival of energy micro-sources makes it possible to consider other protection scenarios in which the electronic circuit on the smart card performs a minimum active monitoring function. The circuit can then react depending on the result of this monitoring, and trigger countermeasures using the onboard energy.

For example, as described in document reference [1] at the end of this description, it is known how to surround this circuit by a mesh of electrical conductors to detect an opening in the envelope thus formed, and to detect any intrusion that could damage the smart card or compromise information on it. But this type of detection is only possible if there is a power supply to the circuit.

As described in document reference [2], up to now countermeasures have consisted of erasing memories in which confidential information such as keys is stored. However, the disappearance of the keys does not then destroy all confidential information.

The purpose of the invention is to solve this protection problem by using an active countermeasure in the case of an intrusive attack in a secured electronic device such as an integrated circuit for a smart card, this countermeasure being designed to destroy all or some of the electronic blocks implementing the sensitive functions of the circuit.

PRESENTATION OF THE INVENTION

This invention relates to a secure electronic device comprising an electronic circuit containing information to be protected, including:

an energy source;

at least one sensor capable of measuring a determined physical magnitude and outputting a value representative of this magnitude, means of comparing each value with at least one pre-defined threshold outputting the result signals, a device for protection of information comprising means for triggering destruction of at least part of the circuit, a logical intrusion detection device capable of activating the protection device after seeing the result signals, characterised in that it comprises firing means to prime a local or global pyrotechnic micro-charge using electrical energy permanently stored in the energy source.

Advantageously, the firing means may for example be an electrical primer or a fuse.

The device according to the invention may also be fully covered by a pyrotechnic micro-charge, or a micro-charge and a primer may be associated with different elements of the circuit.

Advantageously, the circuit according to the invention comprises a chip in which the micro-charges and the primers are located in the substrate of this chip, for example being placed in micro-cavities on the back face of the substrate, or in the layer in which the transistors are installed, or in a metal layer of the chip.

At least one micro-charge/primer assembly may be associated with a micro-fuse.

The device according to the invention may also comprise at least one micro-coil coupled remotely to a micro-coil in a resonant circuit integrated in a micro-charge.

The energy source may be integrated in the electronic circuit. It may also be an accumulator.

At least one sensor may be integrated in the electronic circuit. The entire device may also be integrated in the electronic circuit.

At least one sensor may be capable of measuring the physical magnitude characterising the circuit or the circuit environment, or a sensor capable of measuring a physical magnitude characterising the input or output communication to or from the said device, or a sensor capable of measuring the energy level of the energy source in order to send a warning signal for a request to recharge or activate the protection device, or a sensor capable of measuring a physical magnitude characterising the electrical connection between the energy source and the logical decision making device.

This type of device, that may be a smart card circuit, can be used for active monitoring, in other words to make permanent measurements of physical parameters characterising normal operation and then triggering destruction of all or some of the electronic modules implementing its sensitive functions whenever necessary.

DETAILED PRESENTATION OF EMBODIMENTS

Figure 1:
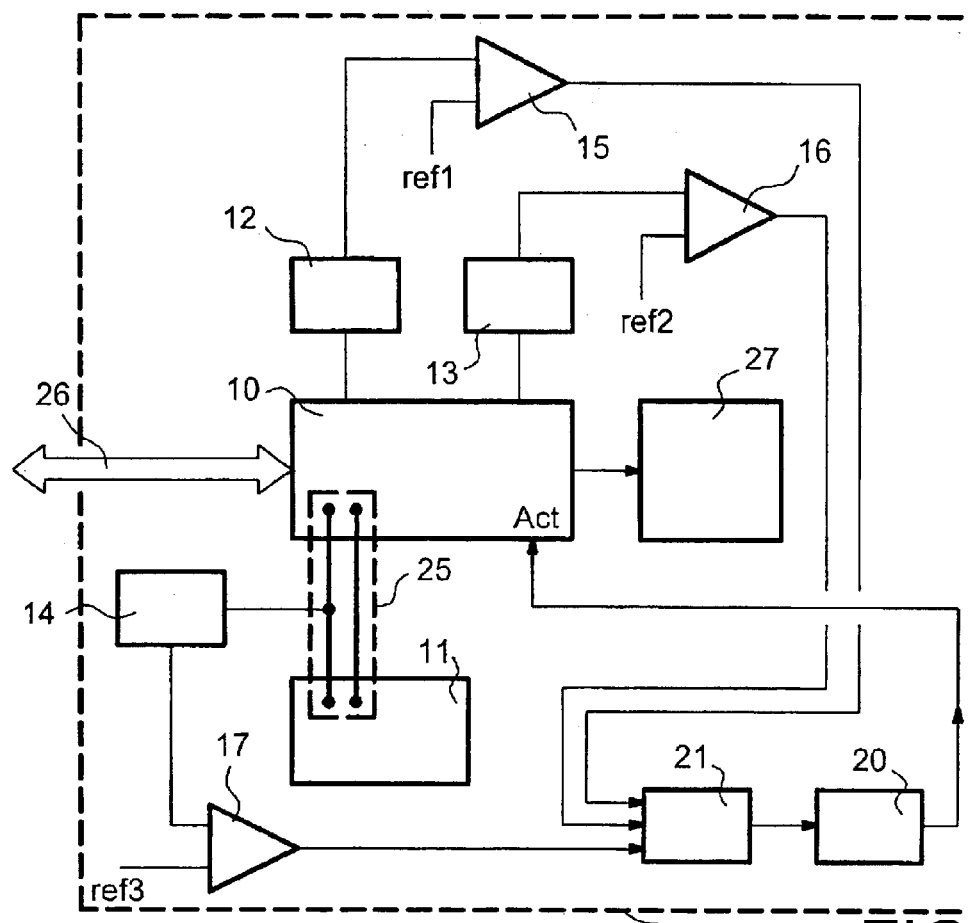
FIG. 1 illustrates the device according to the invention.

As illustrated in FIG. 1, the device according to the invention 9 comprises:

an energy source or micro-source 11, an integrated electronic circuit 10, for example containing a logical processor and a non-volatile memory containing information to be protected, at least one sensor capable of measuring a determined physical magnitude and outputting a value representative of this magnitude, in this case there being three of these sensors: 12, 13, 14, means of comparing each measured value with a predetermined threshold, in this case done by three comparators 15, 16 and 17 each receiving a signal ref1, ref2 and ref3 respectively on one of their two inputs, and the output from the corresponding sensor 12, 13 or 14 on the other input, a device 20 for protection of information contained in the circuit 10, the output of which may for example be connected to an Act (Activate local or global destruction) input of the integrated circuit 10, capable of destroying all or some of the circuit 9 using the pyrotechnic means 27, a logical decision making device 21, capable of activating the protection device 20, receiving the output signals from comparators 15, 16 and 17.

Therefore this secured electronic device according to the invention uses two active functions:

an intrusion detection function, a firing function to prime a local or global pyrotechnic micro-charge using the electrical energy permanently stored in a micro-battery, in other words regardless of whether or not the card is inserted in a reader.

We will now consider each of these elements of the device according to the invention.

The important item to be protected is sensitive information such as data saved in an electronic memory (encryption key, password, etc.) or the architecture of the electronic circuit itself.

The circuit 10 containing this information is the circuit conventionally used in a smart card. For example, it contains the following functions:

a central processing unit (CPU), a read only memory (ROM), a random access memory (RAM), a non-volatile storage memory (EEPROM), a communication interface, with or without contact, that outputs:

the circuit power supply (external), a two-directional communication channel, possibly a clock, possibly a reset processor signal.

It may also contain other functions, for example sensors, comparators, logic, communication.

The energy source 11 may be a micro or mini-battery; a button battery, an ultra-flat battery, an integrated battery, etc. It must be capable of supplying energy to the circuit according to the invention so that the active intrusion detection function and the function to activate the protection by firing one or more micro-charges can be implemented.

This energy source 11 may also be made using processes derived from micro-electronics, for example by adding several technological levels above those conventionally dedicated to making the integrated circuit 10: the energy source 11, the connection and the solid state electrolyte can be manufactured on these levels.

The energy source 11 may also be external to the integrated circuit 10.

The sensors 12, 13 and 14 may be:

environment monitoring sensors; these sensors must check if nominal usage conditions (circuit powered through the communication channel) and circuit standby conditions are actually satisfied. Any detected difference from the reference value may then mean that an intrusion attempt is being made. In particular, these sensors may be:

a temperature sensor to protect the energy source 11, an ultra-violet ray sensor to detect aggression, for example on the EEPROM memory, an X-ray sensor to detect an X-ray type of aggression to the integrated circuit, a protection mesh to detect a reverse engineering attempt, an electric or magnetic field sensor: antenna, etc.

sensors monitoring the communication link 26 between the circuit 9 and the outside. This type of sensor electronically monitors what is happening on the communication link 26. For example:

monitoring the power supply voltage, monitoring the clock signal.

Other functions are possible:

recharging the energy source 11, if it is an accumulator, through the communication link. A function to recharge this accumulator can be integrated inside the circuit according to the invention, regardless of whether the communication is made with or without contact, activation/deactivation of the circuit according to the invention. In some applications, it may be useful to trigger use of the energy source. An On/Off remote control is then available through the communication link, additional protection through a stage on the input side of firing of the pyrotechnic means 27, forming a safety position, for example for transport, so that firing can temporarily be locked, additional storage, for example to save information output from sensors after destruction, to explain the circumstances of the destruction: for example date, disturbed parameter, etc.

For example, in FIG. 1, the first and second sensors 12, 13 are ultra-violet and X-ray sensors, and the third sensor 14 may be a sensor that enables an impedance measurement of the galvanic link 25 between the source 11 and the processing unit 10.

The purpose of the comparison means is to regularly inspect the different parameters output from the sensors 12, 13, 14, and compare them with the different reference values ref1, ref2 and ref3.

For example, the comparators 15, 16 and 17 are operational amplifiers; the reference values ref1, ref2 and ref3 are either internal or imposed from the outside or by the microprocessor.

Comparison means may also:

firstly, detect a low energy level (first threshold) to create an alarm for maintenance action. If the energy source is a rechargeable battery, the action taken will be to detect the charge level below which a warning signal has to be sent to request a recharge, secondly, detect a critical energy level (second threshold) to create an alert and possibly to implement the protection. Since the energy remaining below this second threshold is just sufficient to activate the protection, it has to be triggered to guarantee security.

These various elements may form a so-called protected area that is supposed to be formed by an inseparable circuit. Therefore connections between the various functions (chip, energy source, sensors) are valid at all times and they cannot be attacked or modified. But it is also possible to:

either detect disconnection of a sensor 12, 13 or 14 by checking that the direct measurement is incorrect, or by making calibration means, or compensate for disconnection of the energy source 11 by transmitting energy by other means, at least momentarily.

The purpose of the protection circuit 20 is to protect all confidential information. It uses an active countermeasure in the case of an intrusive attack. This countermeasure is designed to destroy all or some of the electronic blocks that implement sensitive functions of the circuit 9. Therefore the energy source 11 located in the electronic circuit 9 performs continuous active monitoring and triggers countermeasures in a secure manner.

This destruction is achieved by a micro-explosion pulverising the function(s) to be protected. Therefore, there is at least one micro-charge primed by the energy stored onboard, for example in a micro-battery. A reverse engineering attack is no longer possible after such destruction.

This micro-charge may be global or local. If it is global, the circuit 9 is entirely covered by a micro-pyrotechnic charge, and the entire circuit is then destroyed during an explosion. In the second case, the micro-charges are located at different sensitive points, as illustrated in FIG. 2.

Figure 2:
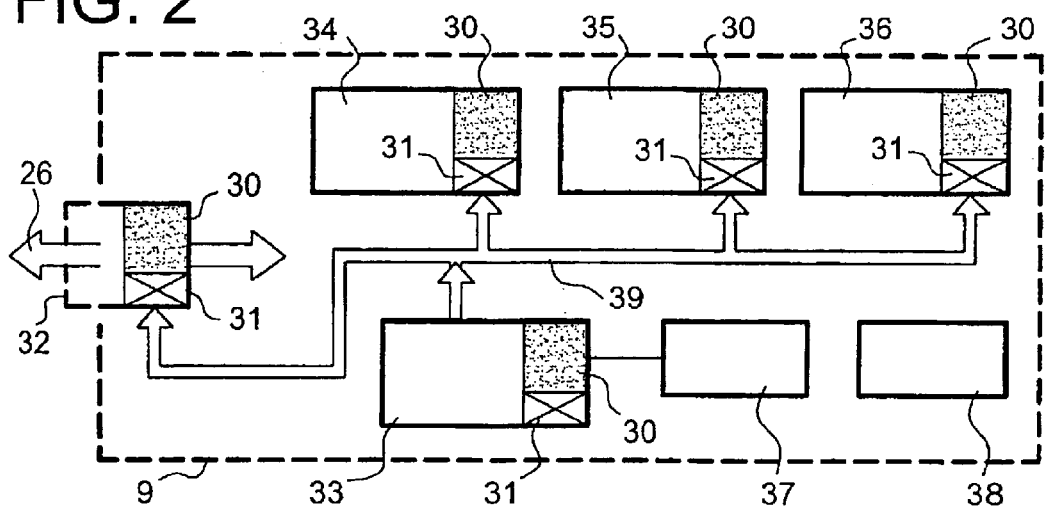
FIG. 2 illustrates a particular embodiment of the device according to the invention.

In this FIG. 2, a micro-charge 30 and a primer (electrical firing) 31 are associated with the different elements in the circuit according to the invention, namely:

input-output pins 32,
the security logic 33,
the keys memory 34,
the cryptography processor 35,
the anti-intrusion sensors 36.

This FIG. 2 also illustrates a trace memory 37, a micro-energy source 38 and a firing signal 39.

In the second case, the primers 31 are triggered either by an electrical signal, or by an integrated micro-fuse connecting the various micro-pyrotechnic charges 30.

Figure 3:
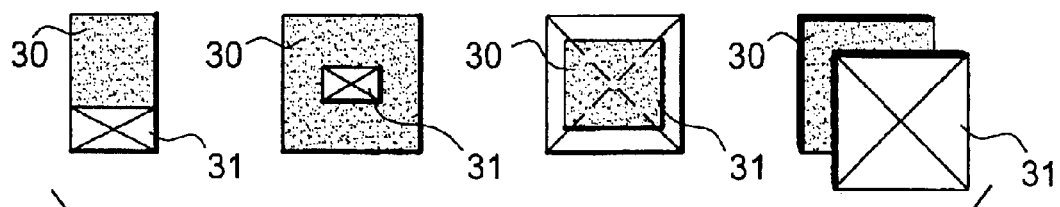
FIG. 3 illustrates different types of load/primer combinations that can be used in the device according to the invention.

FIG. 3 illustrates different types of associations between the micro-charge 30 and primer 31.

Different Example Embodiments

Pyrotechnic materials are deposited essentially by silk-screen or drip feed distribution. The micro-charges 30 and the primers 31 can potentially be made at several levels on the chip corresponding to the circuit 9 according to the invention. There are thus the following various implementation possibilities.

a) "Above IC" Implementation

The pyrotechnic material is deposited on the circuit, and the circuit is for example destroyed by the temperature rise.

b) "Inside IC" Implementation

Figure 4:
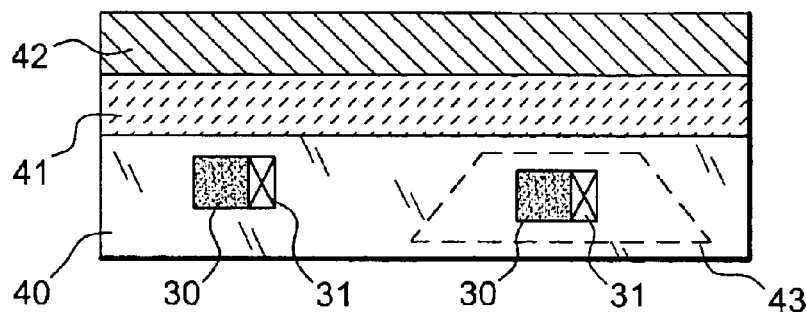
FIGS. 4 to 10 illustrate different examples of embodiments of the device according to the invention.
Figure 5:
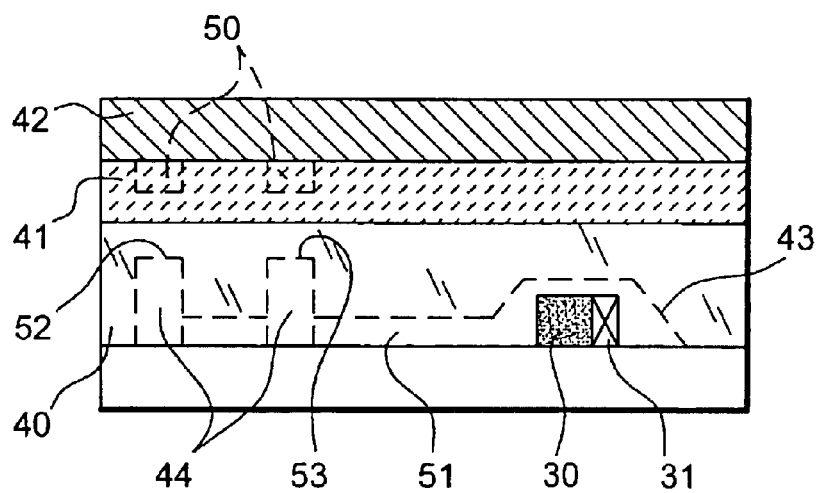

In a first variant, the micro-pyrotechnic charges 30 and the primers 31 are located in the substrate 40 as illustrated in FIG. 4, the other two layers represented being the doping level 41 and the metal level 42. Micro-cavities 43 existing on the back face can then ingenuously be used to place the micro-charges 30 and the primers 31 or to guide and concentrate the mechanical force at the time of the explosion at a precise point. FIG. 5 thus illustrates an example embodiment of the device according to the invention including zones to be protected 50, and a micro-cavity 43 connected to two other micro-cavities 44 through a channel 51. The small predefined surfaces 52 and 53 of these micro-cavities 44 are used to concentrate the mechanical force at the time of the explosion towards these zones 50; the result is a large $$\frac{\text{charge volume}}{\text{area to be destroyed}}$$

ratio.

Figure 6:
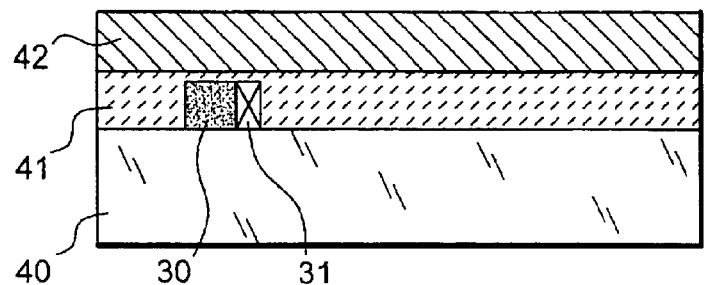

In a second variant, the micro-pyrotechnic charges 30 and the primers 31 are located at the transistors in the layer 41 as illustrated in FIG. 6.

Figure 7:
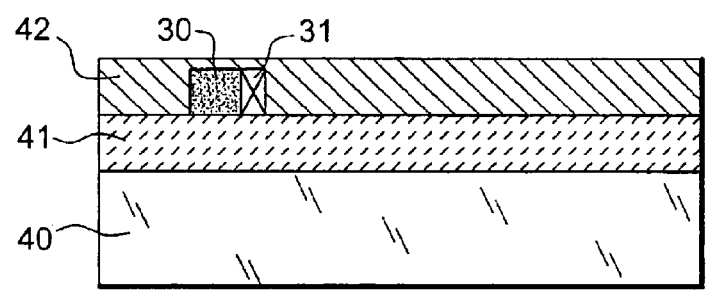

In a third variant, the micro-pyrotechnic charges 30 and the primers 31 are located at level 42 in the metal layers as illustrated in FIG. 7.

c) "Micro-Fuse" Implementation

Figure 8:
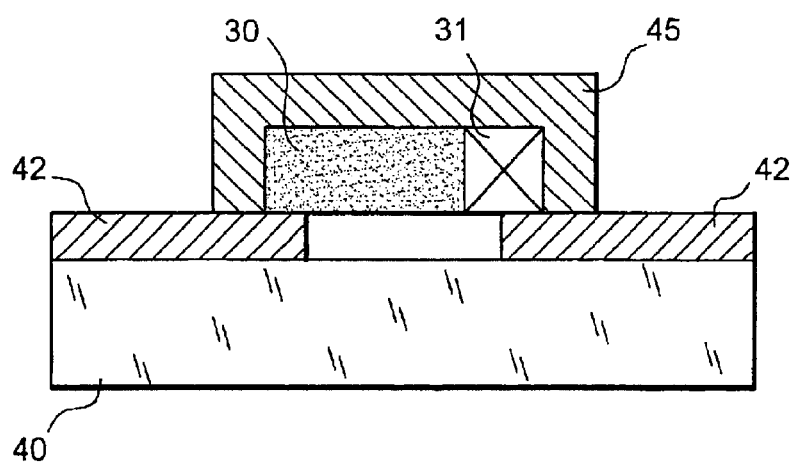
Figure 9:
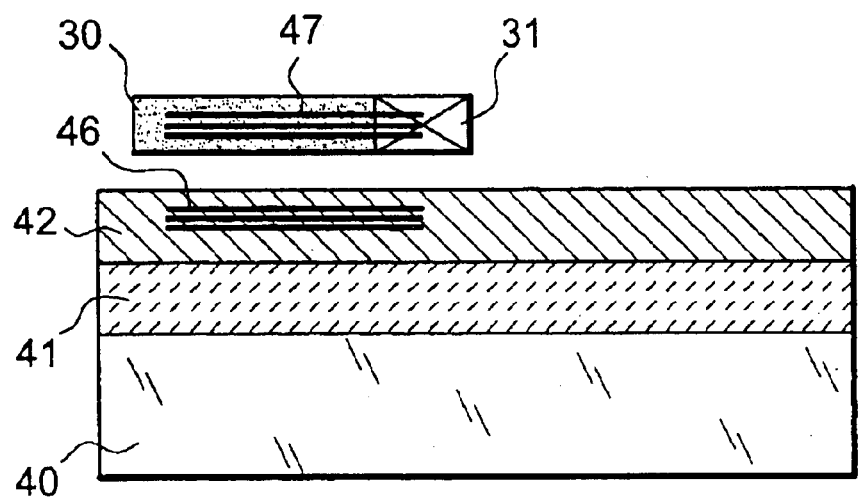

In this example embodiment, micro-fuse functions are implanted. FIG. 8 shows an example of a micro-pyrotechnic fuse 45, the two layers shown being the metal layer 42 and the substrate 40.

d) "Outside IC" Implementation

Figure 10:
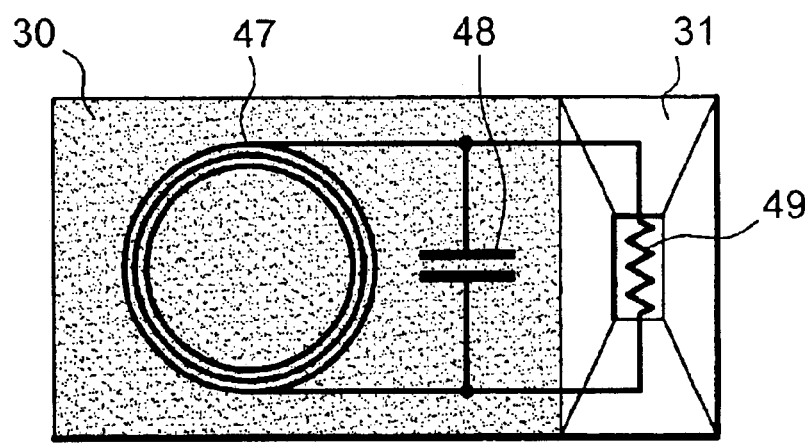

In the case of a circuit 9 made using conventional technology, the explosive charge 30, 31 can be placed on the outside and triggered remotely, for example using a contact free device by inductive coupling, to avoid modifying the manufacturing process of the said circuit. In this case, as illustrated in FIG. 10, the explosive charge is composed of a micro-charge 30 and a primer 31 connected to a resonant circuit composed firstly partly of a micro-coil 47. A micro-coil 46 located in the equivalent size layer 42 composed of the final metal layer(s) is used to trigger firing.

As shown in the top view in FIG. 10, a resonant circuit composed of the micro-coil 47, a tuning capacitor 48, and a heating resistor 49 can then be integrated in the micro-pyrotechnic charge 30 to trigger the primer 31.

REFERENCES

[1] "Design principles for tamper-resistant smartcard processors" by Oliver Kömmerling and Markus G. Kuhn (Proceedings of the USENIX Workshop on smartcard technology, Chicago, Ill., USA May 10–11 1999, pages 1 to 12)

[2] "Tamper resistance—a cautionary note" by Ross Anderson and Markus Kuhn (Second USENIX Workshop on Electronic Commerce Proceedings, Oakland, Calif., Nov. 18–21 1996, pages 1 to 11).

What is claimed is:

1. Secure electronic device comprising at least an electronic circuit containing information to be protected, including:

an energy source (11);

at least one sensor (12, 13, 14) capable of measuring a determined physical magnitude and outputting a value representative of this magnitude, means (15, 16, 17) of comparing each value with at least one predefined threshold (ref1, ref2, ref3) outputting result signals, a device (20) for protection of information comprising means for triggering destruction of at least part of the circuit, a logical intrusion detection device (21) capable of activating the protection device after seeing the result signals, characterised in that it comprises firing means (31) that enable priming of a local or global pyrotechnic micro-charge (30) using electrical energy permanently stored in the energy source.

2. Device according to claim 1, in which the firing means include an electrical primer (31) or a fuse.

3. Device according to claim 2, which is fully covered by a pyrotechnic micro-charge.

4. Device according to claim 2, in which at least a micro-charge (30) and at least a primer (31) are associated with at least one element of the circuit.

5. Device according to claim 2, in which the circuit is composed of a chip in which the micro-charges (30) and the primers (31) are located in the substrate of this chip.

6. Device according to claim 5, in which the micro-charges (30) and the primers (31) are located in micro-cavities on the back face of the substrate.

7. Device according to claim 2, in which the circuit is composed of a chip in which the micro-charges (30) and the primers (31) are located in the layer in which the transistors are installed.

8. Device according to claim 2, in which the circuit is composed of a chip in which the micro-charges (30) and the primers (31) are located in a metal layer of the chip.

9. Device according to claim 2, in which at least one micro-charge (30)/primer (31) assembly may be associated with a micro-fuse (45).

10. Device according to claim 2, comprising at least one micro-coil (46) coupled remotely to a micro-coil (47) in a resonant circuit integrated in a micro-charge (30).

11. Device according to claim 1, in which the energy source (11) is integrated in the electronic circuit.

12. Device according to claim 1, in which the energy source (11) is an accumulator.

13. Device according to claim 1, in which at least one sensor is integrated in the electronic circuit.

14. Device according to claim 1, in which the entire device is integrated in the electronic circuit.

15. Device according to claim 1, in which at least one sensor (12, 13, 14) is capable of measuring a physical magnitude characterising the circuit or the circuit environment.

16. Device according to claim 1, in which at least one sensor (12, 13, 14) is capable of measuring a physical magnitude characterising the input or output communication to or from the said device.

17. Device according to claim 1, in which at least one sensor (12, 13, 14) is capable of measuring the energy level of the energy source in order to send a warning signal for a request to recharge or activate the protection device.

18. Device according to claim 1, in which at least one sensor (12, 13, 14) is capable of measuring a physical magnitude characterising the electrical connection between the energy source (11) and the logical decision-making device.

19. Device to be implemented in a smart card, according to any one of the previous claims.

* * * * *